United States Patent [19]
Bailey et al.

[11] 4,137,123
[45] Jan. 30, 1979

[54] TEXTURE ETCHING OF SILICON: METHOD

[75] Inventors: William L. Bailey, Scottsdale; Michael G. Coleman, Tempe; Cynthia B. Harris, Phoenix; Israel A. Lesk, Scottsdale, all of Ariz.

[73] Assignee: Motorola, Inc., Schaumburg, Ill.

[21] Appl. No.: 645,573

[22] Filed: Dec. 31, 1975

[51] Int. Cl.² .............................................. H01L 31/18
[52] U.S. Cl. ................................ 156/647; 136/89 CC; 156/662; 252/79.5
[58] Field of Search ................... 156/7, 17, 654, 662, 156/647; 252/79.5; 29/572; 136/89 CC

[56] References Cited

U.S. PATENT DOCUMENTS

| | | | |
|---|---|---|---|
| 3,506,509 | 4/1970 | Kragness | 252/79.5 |
| 3,655,582 | 4/1972 | Dupree et al. | 252/79.5 |
| 3,721,588 | 3/1973 | Hays | 156/17 |
| 3,765,969 | 10/1973 | Kragness et al. | 252/79.5 |
| 3,909,325 | 9/1975 | Church et al. | 252/79.5 |
| 3,966,517 | 6/1976 | Claes et al. | 156/7 |
| 4,046,594 | 9/1977 | Tarui et al. | 156/662 |

FOREIGN PATENT DOCUMENTS

751084 1/1967 Canada .............................. 136/89 CC

*Primary Examiner*—Jerome W. Massie
*Attorney, Agent, or Firm*—Lowell E. Clark

[57] ABSTRACT

A surface etchant for silicon comprising an anisotropic etchant containing silicon is disclosed. The etchant provides a textured surface of randomly spaced and sized pyramids on a silicon surface. It is particularly useful in reducing the reflectivity of solar cell surfaces.

3 Claims, 4 Drawing Figures

TEXTURE ETCHING OF SILICON: METHOD

BACKGROUND OF THE INVENTION

This invention relates to an etchant for providing textured silicon surfaces and to a method therefor. More paticularly, this invention relates to a new preferential etchant for reducing the reflectivity of silicon solar cell surfaces.

Solar cell efficiency is enhanced if the reflectivity of the silicon surface is reduced in order to increase the amount of light absorbed by the cell. Prior art researchers have recognized the desirability of altering silicon surfaces, preferably by chemical etching. For example, the paper titled "V-Grooved Silicon Solar Cells" by Cosmo R. Baraona and Henry W. Brandhorst, NASA TM X-71715, presented at the 11th Photovoltaic Specialist Conference sponsored by IEEE at Phoenix, Ariz., May 6-8, 1975, reports the results of using two different etchants on silicon solar cell surfaces. While one of the preferential etchants, hydrazine hydrate, did provide the desired velvet texturized surface, this etch is undesirable from a safety viewpoint. Efforts to employ the more attractive potassium hydroxide etch were unsuccessful. Thus, by using photomasks, and a near boiling potassium hydroxide-water mixture, grooved and gridded surfaces having some improvement over polished surfaces with respect to total reflection were obtained. However, the improvement in reflection was not sufficient to consider this a feasible approach. The use of a potassium hydroxide etch on unmasked silicon resulted in a shiny surface which was ineffective for reducing reflection. Thus, there is still a need for a practical and effective etch to provide the texturized surfaces found to be desirable in solar cells.

SUMMARY OF THE INVENTION

It is an object of this invention to provide an improved etch for making texturized silicon surfaces.

It is a further object of the present invention to provide a safe, effective method for etching the surfaces of solar cells.

In accordance with this invention, there is provided a surface etchant for silicon comprising an anisotropic etchant containing silicon.

This invention will be better understood by reference to the following description of the invention and the accompanying drawings.

DETAILED DESCRIPTION OF THE INVENTION

More in detail, the surface etchant of this invention comprises an anisotropic etchant containing 0.05 to 10 percent by weight of silicon, and preferably 0.5 to 1.0 percent by weight.

Suitable anisotropic etchants include aqueous solutions of alkali metal hydroxide or ammonium hydroxide which optionally contain a monohydric, dihydric or polyhydric alcohol. Preferably solutions of potassium hydroxide optionally containing isopropyl alcohol or ethylene glycol are employed. It is further preferred to utilize a solution comprising 0 to 75% by volume ethylene glycol, 0.05 to 50% by weight potassium hydroxide, the balance being water.

The silicon component of the etchant of this invention is a soluble silicon compound which can be introduced into the etchant by the dissolution of either silicon particles or a silicon-containing compound. Typical silicon-containing compounds include potassium silicate, sodium silicate, etc. Where a silicon-containing compound is employed, the amount is dependent upon the silicon content, all percentages in the claims and specification herein being calculated as silicon.

The etchant of this invention is made by mixing the ingredients. The etch is then applied to the surface to be treated in any conventional manner, for example, by dipping, immersion, spraying, etc. The etch conditions such as etch temperature and etch time are dependent upon the components of the individual etchant. However, generally the rate of etching is increased by employing a heated etchant. Accordingly, rates satisfactory for commercial operations are generally achieved by maintaining the etchant at about 50° C. to about 100° C. After the surface has been etched, the surface is rinsed and dried and further processed into the desired devices. It should be noted that it is not critical that the etchant be removed from the surface after the desired textured surface is obtained. Thus, no surface damage results from maintaining the etchant in contact with the surface for extended periods of time.

Figure 1:
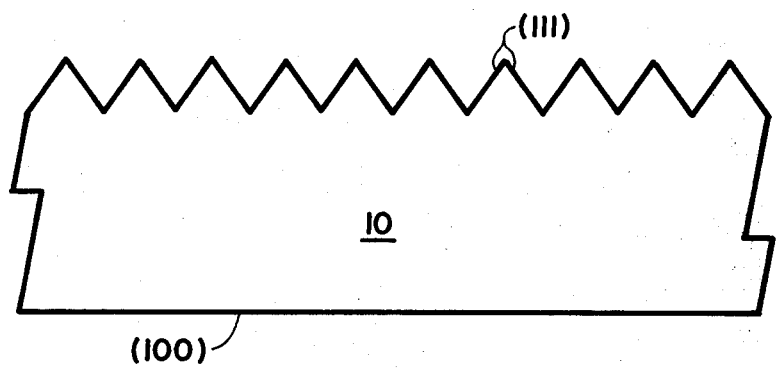
FIG. 1 illustrates a cross-sectional schematic diagram of a silicon substrate having a textured surface in accordance with this invention.

Referring now to the drawings, FIG. 1 illustrates a cross-sectional schematic diagram of a silicon wafer which has been treated with the etchant of this invention. The plane of silicon wafer is of a (100)-type crystal plane as represented in the drawing. After etching, the surface comprises a number of faceted pyramidal peaks. More specifically, these pyramids have triangular sides of the (111)-type planes and bases along the (100)-type plane.

The texture etching represented in FIG. 1 differs from the conventional anisotropic etching. Thus, the latter step results in broad flat valleys or plateaus of exposed (100)-type surfaces surrounded by (111)-type ridges or sides. It is a surprising and unexpected feature of this invention that the addition of silicon to an anisotropic etch results in a etchant which provides a textured surface.

Figure 2:
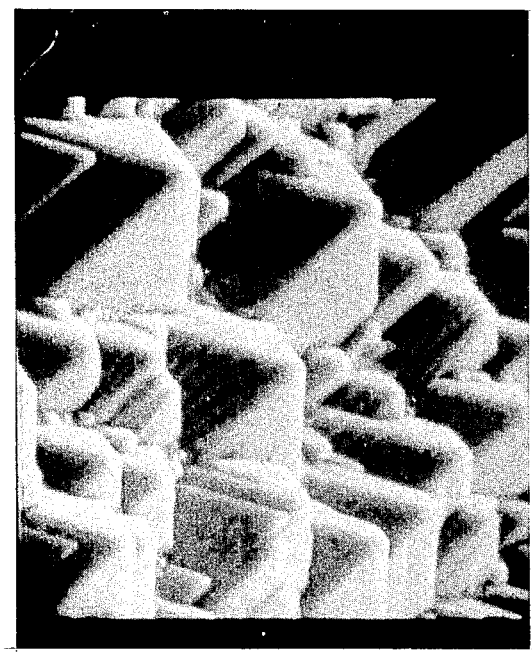
FIG. 2 is a scanning electron micrograph (10,000X magnification) of a surface etched in accordance with this invention and viewed from a 45° angle from the surface.
Figure 3:
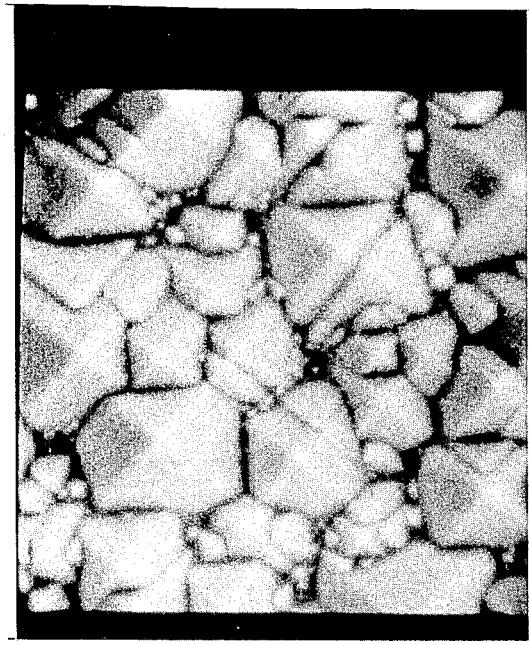
FIG. 3 is a scanning electron micrograph (10,000X magnification) of the surface of FIG. 2 viewed from a 90° angle to the sample surface.
Figure 4:
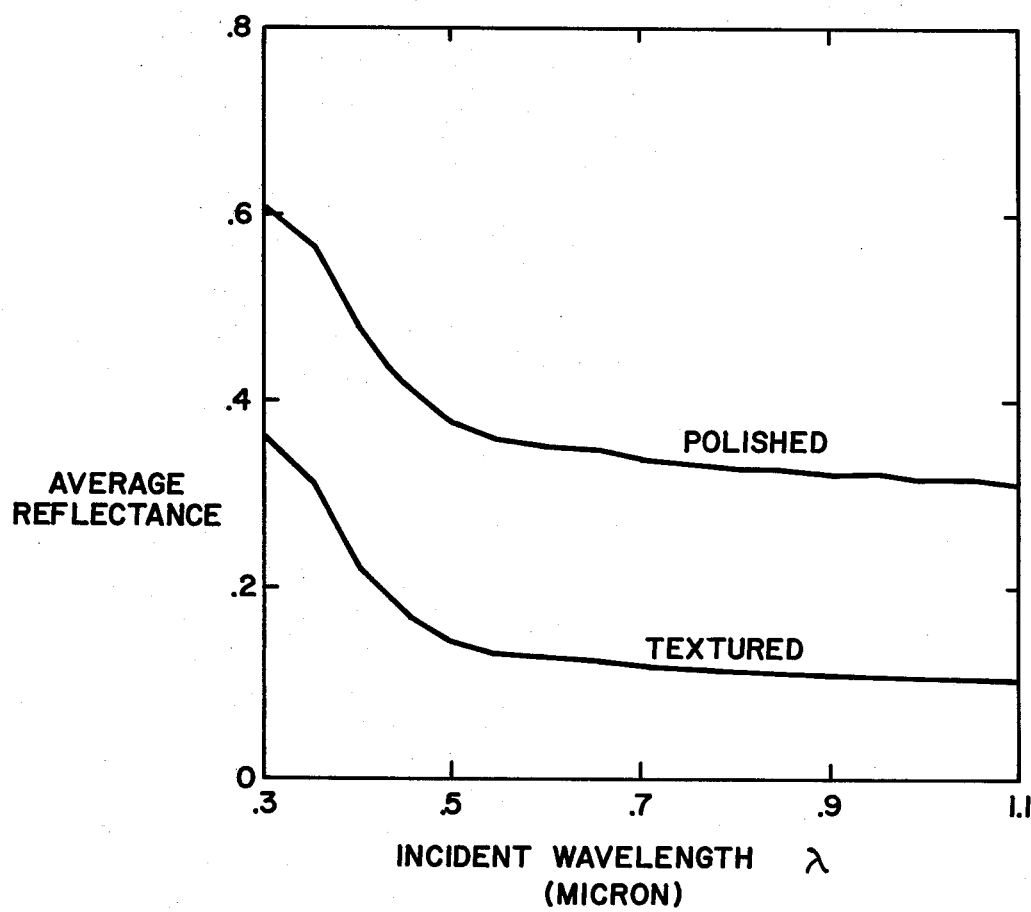
FIG. 4 shows the difference in reflectance between a polished surface and a surface textured in accordance with this invention.

FIGS. 2 and 3 show the rough solar cell surface obtained using the etchant of this invention. Thus, particularly with reference to FIG. 2, it is apparent that the surface consists of a random distribution of minute pyramids completely covering the surface. This textured surface causes light reflected from the first impingement on the solar cell surface to strike the solar cell at least a second time, thereby increasing the amount of light absorbed in the solar cell and improving cell efficiency. FIG. 4 confirms the improved reflectance of a textured solar cell. This graph in FIG. 4 shows the average reflectance of a polished surface and a surface textured in accordance with this invention for light with wavelengths between 0.3 micron and 1.1 microns. The values have been computed assuming that light is incident in a direction normal to the plane of the cell substrate and is composed of equal parts of transverse electric and transverse magnetic wave fronts. The differences between bare polished silicon surfaces and textured silicon surfaces are readily apparent from FIG. 4.

While the textured coated surface of this invention represents a major improvement over polished surfaces, reflectance can be reduced even further by applying a suitable anti-reflection coating on the textured surface. Illustrative antireflection coatings include tantalum oxide, silicon monoxide, silicon nitride, etc.

The textured surface provided by the etchant of this invention can be produced on any type of silicon surface condition. Thus, sawed, etched, lapped, and polished surfaces can be treated to provide the desired textured surface.

In addition to reducing reflectance, the textured surfaces obtained in accordance with this invention provide a surface which is relatively free of work damage. Thus, plane surfaces generally have damaged areas resulting from the polishing step. This type of damage is known to adversely affect both carrier lifetimes and surface recombination velocities; elimination of this type of damage is another desirable feature of this invention.

The following examples will serve to further illustrate the practice of this invention.

EXAMPLE 1

An etchant solution was made by dissolving 7.0 g. of silicon in a solution of 500 ml $H_2O$, 25 g. potassium hydroxide and 50 ml of ethylene glycol. The solution was covered and heated to 80° C. Silicon wafers having a (100)-type orientation were immersed in the heated etchant solution. After one hour of immersion in the heated solution, the wafers were removed, rinsed in water and dried. The wafers were examined under an electron microscope and found to have the textured surfaces shown in FIGS. 2 and 3. Reflectance measurements before and after etching indicated that the etching step reduced reflectance from about 30 percent to about 9 percent. The wafers were then processed into solar cells which were tested and found to be operable.

EXAMPLE 2

An etchant solution was prepared from 0.5 g. silicon, 1.5 g. potassium hydroxide and 200 ml. water. Silicon wafers were etched following the procedure described in Example 1 but removing the wafers from the etchant after 10 minutes. A textured surface as described in Example 1 was obtained.

What is claimed is:

1. A method for decreasing the reflectance of a silicon surface in the wavelength range 0.3 to 1.1 microns comprising:
    contacting said surface with an etchant comprising an anisotropic etchant containing 0.5 to 10 percent by weight of silicon prior to said contacting; and
    etching said surface in said etchant comprising an anisotropic etchant to achieve a pyramidal-shaped texture.

2. The method of claim 1 wherein said anisotropic etchant is maintained at a temperature of between about 50° to about 100° C.

3. The method of claim 1 wherein said etchant is provided by dissolving silicon in an anisotropic etchant comprising 0 to 75% by volume ethylene glycol, 0.05 to 50% by weight potassium hydroxide, the balance being water.

* * * * *